(12) United States Patent
Wang et al.

(10) Patent No.: US 7,528,745 B2
(45) Date of Patent: May 5, 2009

(54) DIGITAL DOMAIN SAMPLING RATE CONVERTER

(75) Inventors: Song Wang, San Diego, CA (US); Eddie L. T. Choy, Carlsbad, CA (US); Prajakt V. Kulkarni, San Diego, CA (US); Samir Kumar Gupta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/452,836

(22) Filed: Jun. 13, 2006

(65) Prior Publication Data

US 2007/0192390 A1 Aug. 16, 2007

Related U.S. Application Data

(60) Provisional application No. 60/773,876, filed on Feb. 15, 2006.

(51) Int. Cl.
*H03M 7/00* (2006.01)
(52) U.S. Cl. .................. 341/61; 708/270; 708/290; 708/300; 708/313
(58) Field of Classification Search .................. 341/61; 708/313
See application file for complete search history.

(56) References Cited

U.S. PATENT DOCUMENTS

| | | | |
|---|---|---|---|
| 4,020,332 A | | 4/1977 | Crochiere et al. |
| 4,472,785 A | * | 9/1984 | Kasuga ................ 708/270 |
| 5,506,798 A | | 4/1996 | Shimada et al. |
| 5,696,708 A | | 12/1997 | Leung |
| 5,907,295 A | * | 5/1999 | Lin ...................... 341/61 |

(Continued)

FOREIGN PATENT DOCUMENTS

EP 1458097 A1 9/2004

(Continued)

OTHER PUBLICATIONS

Crochiere, R. et al., "Interpolation and Decimation of Digital Signals—A Tutorial Review", Proceedings of the IEEE, 69(3): 300-331, Mar. 1981.

(Continued)

*Primary Examiner*—Khai M Nguyen
(74) *Attorney, Agent, or Firm*—Timothy F. Loomis; Espparico Diaz Hidalgo

(57) ABSTRACT

Techniques are described for sampling rate conversion in the digital domain by up-sampling and down-sampling a digital signal according to a selected intermediate sampling frequency. A prototype anti-aliasing filter that has a bandwidth with multiple factors is stored in memory. The techniques include selecting an intermediate sampling frequency to be an integer multiple of a desired output sampling frequency of a digital signal based on the factors of the prototype filter, and selecting a down-sampling factor to be the same integer associated with the selected intermediate sampling frequency. A filter generator generates an anti-aliasing filter for the selected down-sampling factor based on the prototype filter. A sampling rate converter up-samples the digital signal at an input sampling frequency to the selected intermediate sampling frequency, filters the digital signal with the derived anti-aliasing filter, and down-samples the digital signal by the selected down-sampling factor to the desired output sampling frequency.

39 Claims, 6 Drawing Sheets

U.S. PATENT DOCUMENTS

| | | |
|---|---|---|
| 5,935,199 A | 8/1999 | Del Signore |
| 6,057,789 A * | 5/2000 | Lin .............................. 341/61 |
| 6,208,671 B1 * | 3/2001 | Paulos et al. ................ 370/545 |
| 6,546,407 B2 * | 4/2003 | Jiang et al. .................. 708/313 |
| 6,778,106 B2 * | 8/2004 | Lenez et al. ................... 341/61 |
| 6,847,313 B2 * | 1/2005 | Biswas ......................... 341/61 |
| 6,987,473 B1 * | 1/2006 | Nussbaum .................. 341/143 |
| 7,236,110 B2 * | 6/2007 | Antonesei .................... 341/61 |
| 7,342,518 B2 * | 3/2008 | Midya et al. .................. 341/61 |
| 2001/0025290 A1 | 9/2001 | Schollhorn |
| 2002/0140853 A1 * | 10/2002 | Yang et al. .................. 348/441 |
| 2004/0145502 A1 * | 7/2004 | Thomson ..................... 341/61 |

FOREIGN PATENT DOCUMENTS

| | | |
|---|---|---|
| GB | 2372393 A | 8/2002 |
| JP | 10065494 A | 3/1998 |

OTHER PUBLICATIONS

PCT Search Report, PCT/US2007/062250, Jul. 27, 2007.
International Preliminary Report on Patentability, PCT/US07/062250, International Search Authority EP, Aug. 19, 2008.
Written Opinion PCT/US07/062250, International Search Authority European Patent Office Aug. 15, 2008.

* cited by examiner

DIGITAL DOMAIN SAMPLING RATE CONVERTER

RELATED APPLICATIONS

The present application claims the benefit of U.S. Provisional Application Patent No. 60/773,876 filed Feb. 15, 2006.

TECHNICAL FIELD

This disclosure relates to sampling rate converters and, more particularly, digital domain sampling rate converters.

BACKGROUND

A sampling rate converter is used to change a sampling frequency of a digital signal, and may also be referred to as a re-sampler. A sampling rate converter may take the form of a hardware device and/or software, and may be either an up-sampler or a down-sampler. An up-sampler increases the sampling rate of a digital signal. A down-sampler reduces the sampling rate of the digital signal. A sampling frequency conversion rate is defined to be the ratio of a desired output sampling frequency to a given input sampling frequency. An up-sampling conversion rate is always greater than 1.0, while a down-sampling conversion rate is always less than 1.0.

Aliasing is a phenomenon that usually occurs when converting an analog signal to a digital signal, or vice versa. Aliasing may also occur when converting the sampling frequency of a digital signal. When aliasing occurs, signal energy at one frequency is imaged to other frequencies. For example, suppose a signal has two sinusoidal components at 1 kHz and 7.5 kHz, respectively. If the signal is sampled at 16 kHz, the signal can be reconstructed perfectly. If the signal is down-sampled to 4 kHz from 16 kHz by decimation, the energy at 1 kHz will not change, but the energy at 7.5 kHz will be imaged to 0.5 kHz. The energy at 0.5 kHz is considered aliasing. As another example, if an analog sinusoidal signal at 1 kHz is sampled at 4 kHz, the energy will appear to be at 1 kHz, which is desirable. However, if the signal is up-sampled to 16 kHz by inserting three zeros between adjacent samples, the energy will appear to be at 1 kHz, 3 kHz, 5 kHz and 7 kHz. The energy at 3 kHz, 5 kHz and 7 kHz is an image of the energy at 1 kHz and is considered aliasing. To reduce distortion due to aliasing, sampling rate converters typically include an anti-aliasing filter, which is generally a low pass filter.

Anti-aliasing filters are generally needed in both up-samplers and down-samplers. For example, a conventional down-sampler typically includes an anti-aliasing filter and a decimator. In some cases, a down-sampler may include a digital-to-analog converter that converts an original digital signal to an analog signal, and an analog-to-digital converter that samples the analog signal at a desired sampling frequency. However, this type of down-sampler requires dedicated hardware support, which can increase the size and cost of the down-sampler.

In other cases, a down-sampler may perform sampling frequency conversions strictly in the digital domain. A digital domain down-sampler can be implemented in three stages when the down-sampling rate is expressed as a ratio of two positive integers. As an example, let the down-sampling rate be I/D, where I and D are relatively prime positive integers and D is strictly greater than I. First, the digital signal is interpolated by a factor of I. Then, an anti-aliasing filter filters the interpolated digital signal. Last, the digital signal is decimated by a down-sampling factor of D. The bandwidth of the anti-aliasing filter in the down-sampler is $\pi/D$, where D is the down-sampling factor. Therefore, each different down-sampling rate D requires a different anti-aliasing filter. A single prototype anti-aliasing filter may be used to generate an anti-aliasing filter for each desired sampling rate using linear interpolation. However, in order to achieve high performance, a very narrow band prototype anti-aliasing filter with a large number of coefficients is required.

SUMMARY

In general, the disclosure relates to techniques for sampling rate conversion in the digital domain by up-sampling and down-sampling a digital signal according to a selected intermediate sampling frequency. The techniques include selecting an intermediate sampling frequency to be an integer multiple of a desired output sampling frequency of a digital signal. The techniques also include selecting a down-sampling factor to be the same integer associated with the selected intermediate sampling frequency. A sampling rate converter up-samples the digital signal at an input sampling frequency to the selected intermediate sampling frequency, and then down-samples the digital signal by the selected down-sampling factor to the desired output sampling frequency.

The sampling rate converter includes both an up-sampler and a down-sampler. The up-sampler supports arbitrary rational up-sampling rates to convert the input sampling frequency to the selected intermediate sampling frequency by performing up-sampling and interpolation, band-limited interpolation, direct interpolation or other up-sampling methods. The down-sampler supports only integer down-sampling factors to convert the selected intermediate sampling frequency to the desired output sampling frequency.

Different down-sampling factors require different anti-aliasing filters in the down-sampler. To avoid storing large numbers of anti-aliasing filters in memory, a prototype anti-aliasing filter that has a bandwidth with multiple factors is stored in memory. The selected intermediate sampling frequency may be an integer multiple of the desired output sampling frequency where the integer is one of the multiple factors associated with the prototype filter.

A filter generator generates an anti-aliasing filter for the selected down-sampling factor of the digital signal based on the prototype filter using decimation. Therefore, in some embodiments, only one prototype filter may need to be stored in memory regardless of the conversion rate for the digital signal. Furthermore, the stored prototype anti-aliasing filter may be a relatively short prototype filter with a reduced number of factors. This may be especially useful in a device in which data storage space is limited, such as a mobile wireless communication device (WCD).

In one embodiment, the disclosure provides a method for converting a sampling rate of a digital signal in the digital domain. The method comprises selecting an intermediate sampling frequency of the digital signal to be an integer multiple of a desired output sampling frequency of the digital signal. The method also includes up-sampling the digital signal at an input sampling frequency to the selected intermediate sampling frequency, and down-sampling the digital signal at the selected intermediate sampling frequency to the desired output sampling frequency.

In another embodiment, the disclosure provides a computer-readable medium comprising instructions for converting a sampling rate of a digital signal in the digital domain. The instructions cause a programmable processor to select an intermediate sampling frequency of the digital signal to be an integer multiple of a desired output sampling frequency of the digital signal. The instructions also cause the programmable processor to up-sample the digital signal at an input sampling frequency to the selected intermediate sampling frequency, and down-sample the digital signal at the selected intermediate sampling frequency to the desired output sampling frequency.

In another embodiment, the disclosure provides a device comprising a processor that selects an intermediate sampling frequency of a digital signal to be an integer multiple of a desired output sampling frequency of the digital signal. The processor also converts a sampling rate of a digital signal in the digital domain, wherein the processor up-samples the digital signal at an input sampling frequency to the selected intermediate sampling frequency, and down-samples the digital signal at the selected intermediate sampling frequency to the desired output sampling frequency.

The techniques described herein may be implemented in hardware, software, firmware, or any combination thereof. If implemented in software, the techniques may be realized in whole or in part by a computer readable medium comprising instructions that, when executed by a processor, performs one or more of the methods described herein.

The details of one or more embodiments are set forth in the accompanying drawings and the description below. Other features, objects, and advantages of the invention will be apparent from the description and drawings, and from the claims.

DETAILED DESCRIPTION

Figure 1:
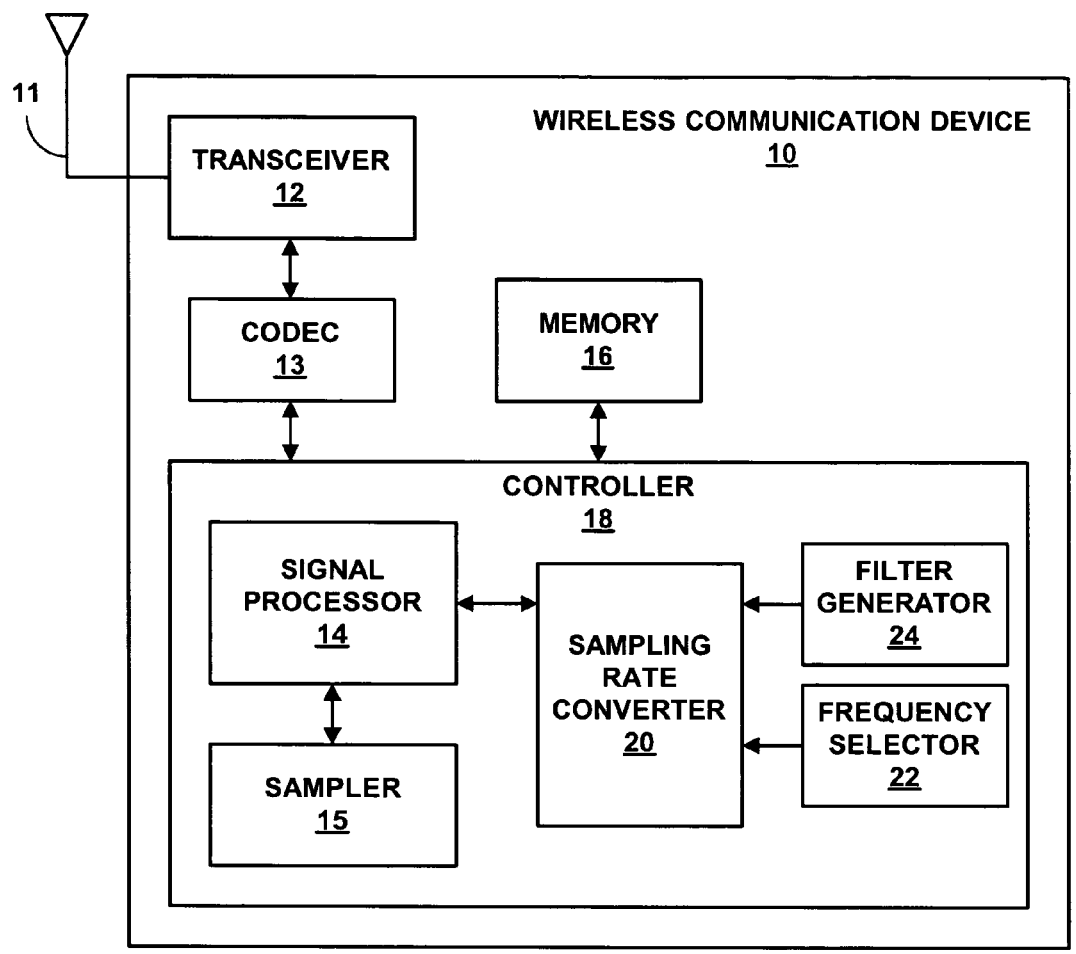
FIG. 1 is a block diagram illustrating a wireless communication device (WCD) including a sampling rate converter in accordance with an embodiment of this disclosure.

FIG. 1 is a block diagram illustrating a wireless communication device (WCD) 10 including a sampling rate converter 20 in accordance with an embodiment of this disclosure. As will be described, sampling rate converter 20 performs sampling rate conversion in the digital domain by up-sampling and down-sampling a digital signal according to a selected intermediate sampling frequency. Sampling rate converter 20 may be useful in a variety of devices, and especially those in which data storage space may be limited, such as WCD 10. However, sampling rate converter 20 may also be useful in other devices, including wired communication devices, packet based communication devices, and devices such as audio playback devices, recording devices, and display devices that are not principally directed to communication. In the example of FIG. 1, sample rate converter 20 resides within WCD 10, which may take the form of a mobile radiotelephone, a satellite radiotelephone, a wireless communication card incorporated within a portable computer, a personal digital assistant (PDA) equipped with wireless communication capabilities, or any of a variety of devices capable of wireless communication.

WCD 10 may communicate with a plurality of base stations. The base stations are generally stationary equipments that wirelessly communicate with WCD 10 in order to provide network access to WCD 10. For example, the base stations may provide an interface between WCD 10 and a public switched telephone network (PSTN) such that telephone calls can be routed to and from WCD 10. Alternatively, or additionally, the base stations may be coupled to a packet-based network for transmission of packet-based voice information or packet-based data.

In the example of FIG. 1, WCD 10 includes an antenna 11, a transceiver 12, a codec (encoder/decoder) 13, a memory 16, and a controller 18. In some embodiments, controller 18 may comprise a mobile station modem (MSM) capable of controlling operation of WCD 10. WCD 10 may receive wireless signals from the base stations with transceiver 12 via antenna 11. Codec 13 then decodes the received wireless signals. Controller 18 receives decoded digital signals at an input sampling rate from codec 13, processes the digital signals, and provides the processed signals to a user of WCD 10 and/or stores the processed signals in memory 16.

Controller 18 includes a signal processor 14, a sampler 15, a sampling rate converter 20, a frequency selector 22 and a filter generator 24. Signal processor 14 processes a digital signal received from codec 13 at an input sampling frequency and sampling rate converter 20 converts the input sampling frequency to a desired output sampling frequency depending on an application for the digital signal. Signal processor 14 may again process the digital signal at the desired output sampling frequency. In other embodiments, controller 18 may include multiple signal processors. In order to provide the signals to the user of WCD 10, sampler 15 comprises a digital-to-analog converter (DAC) and converts the digital signal at the desired output sampling frequency to an analog signal.

WCD 10 may also receive signals from the user of WCD 10. Controller 18 receives analog signals, converts the analog signals to digital signals, and processes the digital signals for transmission. In this case, sampler 15 comprises an analog-to-digital converter (ADC) and converts the analog signal to a digital signal at an input sampling frequency. Signal processor 14 processes the digital signal at the input sampling frequency and sampling rate converter 20 converts the input sampling frequency to a desired output sampling frequency depending on an application for the digital signal. Signal processor 14 may again process the digital signal at the desired output sampling frequency. In other embodiments, controller 18 may include multiple signal processors. Codec 13 encodes the digital signal at the desired output sampling frequency. Transceiver 12 then transmits the encoded wireless signal to the base stations via antenna 11. In some embodiments, controller 18 may include dedicated sets of signal processors, sampling rate converters, and samplers for signals received by transceiver 12 and signals for transmission by transceiver 12.

Prior to processing a digital signal, controller 18 determines a desired output sampling frequency, $f_o$, of the digital signal based on a potential application for the digital signal. Potential applications for the received digital signals use a variety of sampling frequencies. For example, 8 kHz and 16 kHz sampling frequencies are used in voice communication applications. Audio compact disc (CD) applications use a 44.1 kHz sampling frequency. Digital audio tape (DAT) applications use a 48 kHz sampling frequency. Other typical sampling frequencies, including 11.025 kHz, 12 kHz, 12.8 kHz, 22.05 kHz, 24 kHz, 32 kHz, and 44 kHz, may be used in other digital signal applications.

A frequency selector 22 within controller 18 selects an intermediate sampling frequency, $f_m$, of the digital signal to be an integer multiple of the desired output sampling frequency. Controller 18 then selects a down-sampling factor of the digital signal to be the same integer associated with the selected intermediate sampling frequency. Hence, in accordance with an embodiment of this disclosure, up-sampling and down-sampling use the same intermediate frequency.

Sampling rate converter 20 within controller 18 includes both an up-sampler and a down-sampler (not shown) to convert the sampling rate of the digital signal from the input sampling frequency to the desired output sampling frequency according to the selected intermediate sampling frequency. Sampling rate converter 20 first up-samples the digital signal at an input sampling frequency, $f_i$, to the selected intermediate sampling frequency. Sampling rate converter 20 then down-samples the digital signal by the selected down-sampling factor to the desired output sampling frequency.

Sampling rate converter 20 may be configured to provide flexible down-sampling at a variety of different sampling rates. Each down-sampling factor requires a different anti-aliasing filter in a down-sampler within sampling rate converter 20. To avoid storing large numbers of anti-aliasing filters in memory 16, a prototype anti-aliasing filter that has a bandwidth with multiple factors is stored in memory 16. For example, the prototype filter may have bandwidth π/N where N has multiple factors. In some embodiments, two or more prototype anti-aliasing filters may be stored in memory 16 in which each of the prototype filters has different bandwidth with different corresponding factors.

Frequency selector 22 may select the intermediate sampling frequency of the digital signal to be an integer multiple of the desired output sampling frequency where the integer is one of the multiple factors associated with the prototype anti-aliasing filter stored in memory 16. Controller 18 selects the down-sampling factor of the digital signal to be equal to the same one of the multiple factors associated with the prototype filter.

Filter generator 24 within controller 18 generates an anti-aliasing filter for the selected down-sampling factor of the digital signal based on the prototype filter using decimation. Filter generator 24 may generate an anti-aliasing filter by setting a bandwidth of the filter, establishing a number of filter taps, and computing coefficients of the filter. The bandwidth of an anti-aliasing filter defines a frequency range of signal energy that is capable of passing through the anti-aliasing filter.

For example, if the prototype anti-aliasing filter stored in memory 16 has bandwidth π/N and the selected intermediate sampling frequency is $nf_o$, where n is a factor of N, controller 18 selects the down-sampling factor to be n. Filter generator 24 then generates an anti-aliasing filter with bandwidth π/n by decimating the prototype filter by a factor of N/n. In this way, only one prototype filter may need to be stored in memory 16 regardless of the sampling frequency conversion rates for received digital signals. Furthermore, the stored prototype anti-aliasing filter may be a relatively short prototype filter with a reduced number of factors. This may be especially useful in WCD 10 as storage space is limited.

Several specific examples of generating anti-aliasing filters from a prototype filter are presented without limiting the scope of the disclosure. As a first example, an anti-aliasing prototype filter stored in memory 16 may have bandwidth π/60, where 60 is a multiple of 2, 3, 4, 5, 6, 10, 12, 15, 20, 30, and 60. Filter generator 24 may derive anti-aliasing filter 30 from the prototype filter to have bandwidth of π/2, π/3, π/4, π/5, π/6, π/10, π/12, π/15, π/20, π/30, or π/60 using decimation. In other words, the prototype filter stored in memory 16 supports down-sampling factors 2, 3, 4, 5, 6, 10, 12, 15, 20, 30, and 60. Therefore, frequency selector 22 may select an intermediate sampling frequency for a digital signal from a set including $2f_o$, $3f_o$, $4f_o$, $5f_o$, $6f_o$, $10f_o$, $12f_o$, $15f_o$, $20f_o$, $30f_o$, and $60f_o$. In this case, the exemplary prototype filter reduces the amount of storage space used in memory 16 by approximately 64% compared with the space required to store eleven different anti-aliasing filters in memory 16.

As a second example, an anti-aliasing prototype filter stored in memory 16 may have bandwidth π/12, where 12 is a multiple of 2, 3, 4, 6, and 12. The exemplary prototype filter may be sufficient for most speech and audio applications for which support of large conversion rates is not necessary. Filter generator 24 may derive anti-aliasing filter 30 from the prototype filter to have bandwidth of π/2, π/3, π/4, π/6, or π/12 using decimation. In other words, the prototype filter stored in memory 16 supports down-sampling factors 2, 3, 4, 6, and 12. Therefore, frequency selector 22 may select an intermediate sampling frequency of a digital signal from a set including $2f_o$, $3f_o$, $4f_o$, $6f_o$, and $12f_o$. In this case, the exemplary prototype filter reduces the amount of storage space used in memory 16 by approximately 56% compared with the space required to store five different anti-aliasing filters in memory 16.

Figure 2:
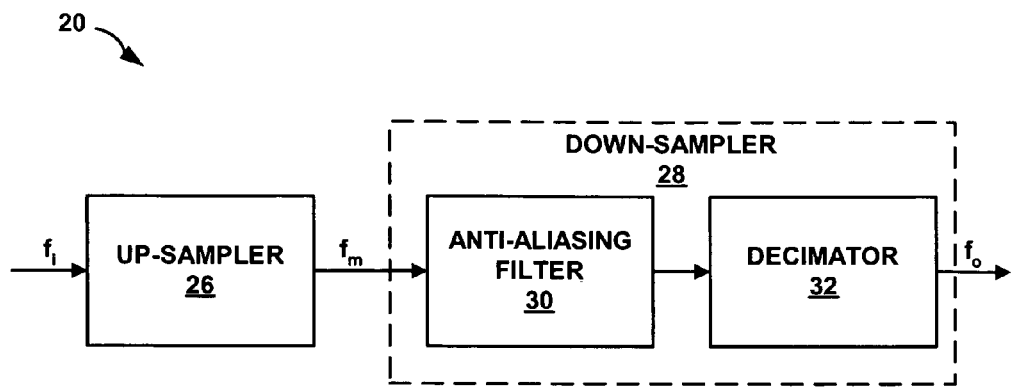
FIG. 2 is a block diagram illustrating the sampling rate converter from FIG. 1 in greater detail.

FIG. 2 is a block diagram illustrating sampling rate converter 20 from FIG. 1 in greater detail. Sampling rate converter 20 includes an up-sampler 26 and a down-sampler 28 that respectively up-sample and down-sample the digital signal in the digital domain according to the selected intermediate sampling frequency.

Up-sampler 26 increases a sampling frequency of the digital signal, producing an up-sampled digital signal with a bandwidth that is wider than the bandwidth of the original digital signal. For up-sampling, distortion to the original digital signal spectrum and energy in the extended frequency band should be controlled to a predetermined level to preserve fidelity of the signal. Up-sampler 26 supports arbitrary rational up-sampling rates to convert the input sampling frequency to the selected intermediate sampling frequency by performing up-sampling and interpolation, band-limited interpolation, direct interpolation, or other up-sampling methods.

Down-sampler 28 decreases a sampling frequency of the digital signal, producing a down-sampled digital signal with a bandwidth that is narrower than the bandwidth of the original digital signal. For down-sampling, distortion to the original digital signal spectrum should be minimized to preserve fidelity of the signal. Down-sampler 28 supports only integer down-sampling factors to convert the selected intermediate sampling frequency to the desired output sampling frequency. Down-sampler 28 includes an anti-aliasing filter 30 and a decimator 32.

Once frequency selector 22 selects the intermediate sampling frequency of the digital signal, up-sampler 26 within sampling rate converter 20 up-samples the digital signal at the input sampling frequency, $f_i$, to the selected intermediate sampling frequency, $f_m$. For example, up-sampler 26 may up-sample the digital signal by expanding the digital signal by an up-sampling factor. Up-sampler 26 may achieve this up-sampling process by inserting a given number of zeros between adjacent input samples of the digital signal. Up-sampler 26 may filter the digital signal to remove any aliasing images or distortion present in the digital signal after the zero insertion process. Up-sampler 26 may then perform interpolation to down-sample the digital signal to the selected intermediate sampling frequency. The interpolation methods include zero-order interpolation, linear interpolation, higher order interpolations, and varieties of spline interpolations.

Down-sampler 28 within sampling rate converter 20 then filters the digital signal with anti-aliasing filter 30 derived from the prototype filter stored in memory 16 according to the selected intermediate sampling frequency. After filtering the digital signal, down-sampler 28 down-samples the digital signal at the intermediate sampling frequency, $f_m$, to the desired output sampling frequency, $f_o$, by decimating the digital signal by the selected down-sampling factor with decimator 32.

Several examples of converting a digital signal from an input sampling frequency to a desired output sampling frequency based on a selected intermediate sampling frequency are presented. As a first example, controller 18 may receive a digital signal at an input sampling rate of 44.1 kHz and determine that a desired output sampling frequency of the digital signal is 8 kHz. In this example, frequency selector 22 selects an intermediate sampling frequency to be 48 kHz, which is an integer multiple of the desired output sampling frequency (i.e., $6f_o$). Controller 18 then selects a down-sampling factor to be equal to 6, which is the same integer associated with the selected intermediate sampling frequency. Up-sampler 26 up-samples the digital signal from 44.1 kHz to 48 kHz. Down-sampler 28 filters the digital signal with anti-aliasing filter 30 with bandwidth $\pi/6$ derived from a prototype filter. Then, down-sampler 28 down-samples the digital signal from 48 kHz to 8 kHz by decimating the digital signal by a factor of 6 with decimator 32.

As a second example, controller 18 may receive a digital signal at an input sampling rate of 48 kHz and determine that a desired output sampling frequency of the digital signal is 44.1 kHz. In this example, frequency selector 22 selects an intermediate sampling frequency to be 88.2 kHz, which is an integer multiple of the desired output sampling frequency (i.e., $2f_o$). Controller 18 then selects a down-sampling factor to be equal to 2, which is the same integer associated with the selected intermediate sampling frequency used by up-sampler 26. Up-sampler 26 up-samples the digital signal from 48 kHz to 88.2 kHz. Down-sampler 28 filters the digital signal with anti-aliasing filter 30 with bandwidth $\pi/2$ derived from a prototype filter. Then, down-sampler 28 down-samples the digital signal from 88.2 kHz to 44.1 kHz by decimating the digital signal by a factor of 2 with decimator 32.

As a third example, controller 18 may receive a digital signal at an input sampling rate of 44.1 kHz and determine that a desired output sampling frequency of the digital signal is 22 kHz. Frequency selector 22 selects an intermediate sampling frequency to be 66 kHz, in this example, which is an integer multiple of the desired output sampling frequency (i.e., $3f_o$). Controller 18 then selects a down-sampling factor to be equal to 3, which is the same integer associated with the selected intermediate sampling frequency. Up-sampler 26 up-samples the digital signal from 44.1 kHz to 66 kHz. Down-sampler 28 filters the digital signal with anti-aliasing filter 30 with bandwidth $\pi/3$ derived from a prototype filter. Then, down-sampler 28 down-samples the digital signal from 66 kHz to 22 kHz by decimating the digital signal by a factor of 3 with decimator 32.

Figure 3:
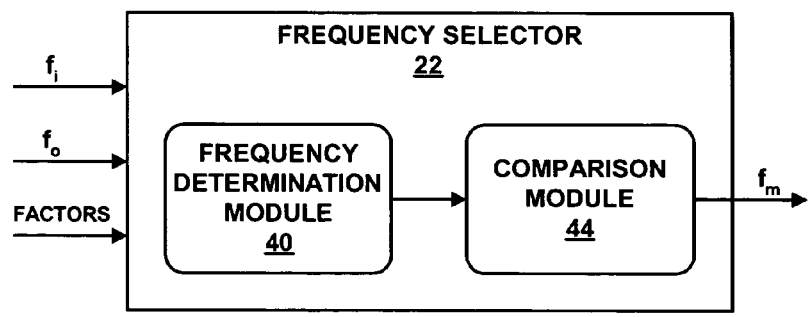
FIG. 3 is a block diagram illustrating a frequency selector from FIG. 1 in greater detail.

FIG. 3 is a block diagram illustrating frequency selector 22 from FIG. 1 in greater detail. Frequency selector 22 within controller 18 selects the intermediate sampling frequency, $f_m$, based on the desired output sampling frequency, $f_o$, and the factors associated with the prototype anti-aliasing filter stored in memory 16. Frequency selector 22 receives the input sampling frequency and the desired output sampling frequency of the digital signal from controller 18. In addition, frequency selector 22 retrieves the factors associated with the prototype filter stored in memory 16.

Frequency determination module 40 within frequency selector 22 determines a set of intermediate sampling frequencies that are integer multiples of the desired output sampling frequency where the integers are the factors associated with the prototype filter. For example, if the prototype anti-aliasing filter has bandwidth $\pi/N$, the corresponding factors may be n−2, n−1, n, and n+1. Frequency determination module 40 determines the set of intermediate sampling frequencies to be $(n-2)*f_o$, $(n-1)*f_o$, $nf_o$ and $(n+1)*f_o$. In some cases, the determined set of intermediate sampling frequencies may not be consecutive.

Comparison module 44 within frequency selector 22 then compares the input sampling frequency, $f_i$, of the digital signal with the set of intermediate sampling frequencies from frequency determination module 40 to determine the lowest one of the set of intermediate sampling frequencies that is greater than or equal to the input sampling frequency. Frequency selector 22 then selects the one of the set of intermediate sampling frequencies as the intermediate sampling frequency of the digital signal. For example, if the input sampling frequency, $f_i$, of the digital signal is greater than $(n-1)*f_o$ but less than $nf_o$, frequency selector 22 selects the intermediate sampling frequency, $f_m$, of the digital signal as equal to $nf_o$.

Figure 4:
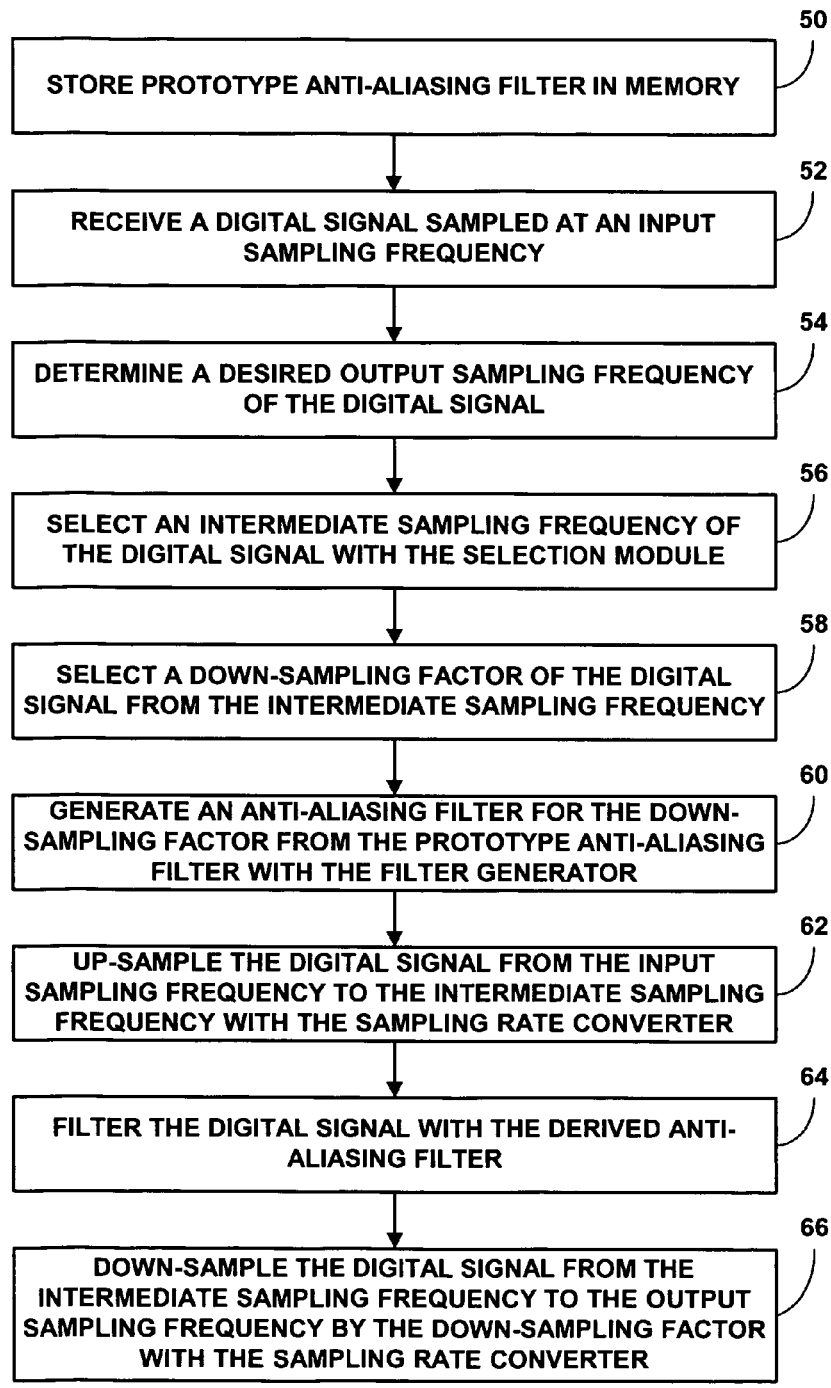
FIG. 4 is a flowchart illustrating conversion an input sampling rate to a desired output sampling rate in the digital domain based on a selected intermediate sampling rate.

FIG. 4 is a flowchart illustrating an exemplary operation of converting an input sampling rate to a desired output sampling rate in the digital domain based on a selected intermediate sampling rate. The operation will be described herein in reference to controller 18 within WCD 10 from FIG. 1. A prototype anti-aliasing filter may be stored in memory 16 of WCD 10 (50). In some cases, a service provider of WCD 10 may store the prototype anti-aliasing filter in memory 16. In other cases, the prototype anti-aliasing filter may be stored in memory 16 upon manufacture of WCD 10. The prototype filter may have bandwidth $\pi/N$ where N has multiple factors. In some embodiments, two or more prototype anti-aliasing filters may be stored in memory 16 in which each of the prototype filters has different bandwidth with different corresponding factors.

Controller 18 receives a digital signal sampled at an input sampling frequency, $f_i$ (52). Controller 18 then determines a desired output sampling frequency, $f_o$, of the digital signal based on a potential application for the digital signal (54). Different digital signal applications use different sampling frequencies. Accordingly, a particular application may specify a required sampling frequency, which controller 18 references for selection of output sampling frequency $f_o$.

Controller 18 sends the input sampling frequency of the digital signal and the desired output sampling frequency to frequency selector 22. Frequency selector 22 selects an intermediate sampling frequency, $f_m$, of the digital signal to be an integer multiple of the desired output sampling frequency (56). Frequency selector 22 performs the selection based on the desired output sampling frequency and the factors associated with the prototype anti-aliasing filter stored in memory 16. For example, if the prototype anti-aliasing filter has bandwidth $\pi/12$, the corresponding factors are 2, 3, 4, 6 and 12.

Frequency selector 22 then selects the intermediate frequency as one of $2f_o$, $3f_o$, $4f_o$, $6f_o$, or $12f_o$.

Controller 18 then selects a down-sampling factor to be the same integer associated with the selected intermediate sampling frequency (58). Continuing the above example, if the selected intermediate sampling frequency is $3f_o$, controller 18 selects the down-sampling factor to be 3. Controller 18 sends the selected down-sampling factor of the digital signal to filter generator 24. Filter generator 24 generates an anti-aliasing filter for the selected down-sampling factor from the prototype anti-aliasing filter stored in memory 16 using decimation (60). If the prototype anti-aliasing filter has bandwidth $\pi/12$ and the selected down-sampling factor is 3, filter generator 24 generates an anti-aliasing filter with bandwidth $\pi/3$ by decimating the prototype filter by a factor of 4.

Up-sampler 26 within sampling rate converter 20 up-samples the digital signal at the input sampling frequency, $f_i$, to the selected intermediate sampling frequency, $f_m$ (62). Down-sampler 28 within sampling rate converter 20 filters the digital signal with anti-aliasing filter 30 derived from the prototype filter stored in memory 16 according to the selected intermediate sampling frequency (64). Down-sampler 28 then down-samples the digital signal at the intermediate sampling frequency, $f_m$, to the desired output sampling frequency, $f_o$, by decimating the digital signal by the selected down-sampling factor with decimator 32 (66).

Figure 5:
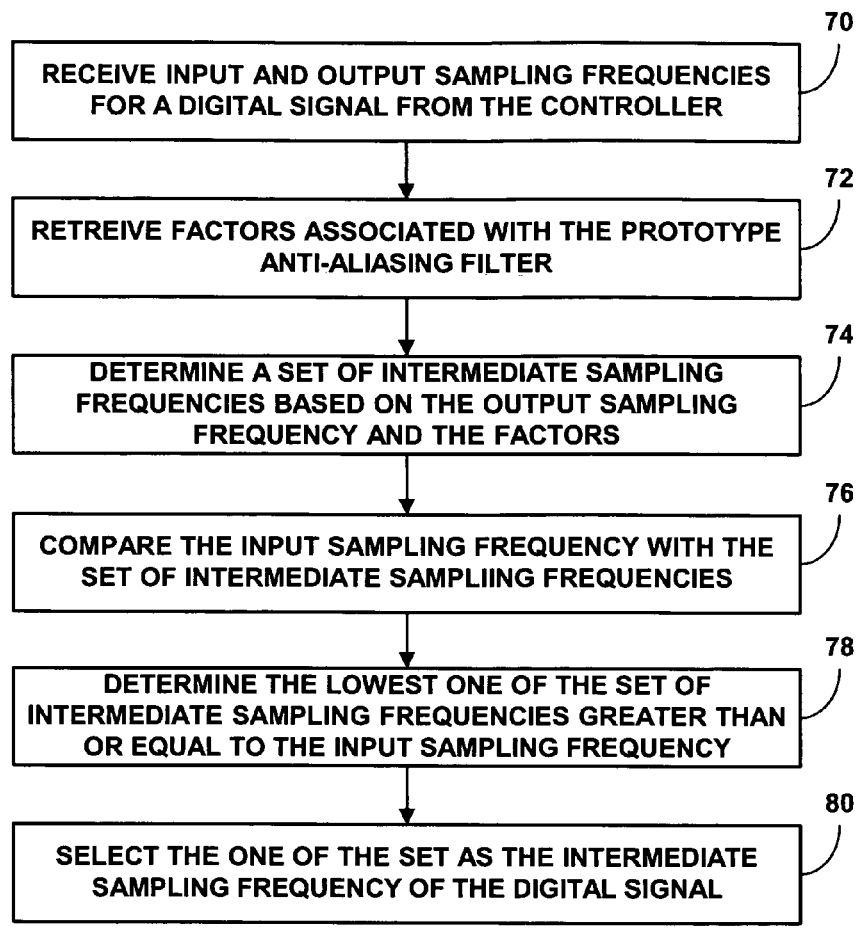
FIG. 5 is a flowchart illustrating selection of an intermediate sampling frequency to convert an input sampling frequency of a digital signal to a desired output sampling frequency in the digital domain.

FIG. 5 is a flowchart illustrating an exemplary operation of selecting an intermediate sampling frequency to convert an input sampling frequency of a digital signal to a desired output sampling frequency in the digital domain. For example, the operation may comprise step 56 from FIG. 6 in greater detail. The operation will be described herein in reference to frequency selector 22 within controller 18 of WCD 10 from FIG. 1.

Frequency selector 22 receives an input sampling frequency and a desired output sampling frequency of a digital signal from controller 18 (70). Frequency selector 22 then retrieves factors associated with a prototype anti-aliasing filter stored in memory 16 (72). The prototype filter may have bandwidth $\pi/N$ where N is has multiple factors. In some embodiments, memory 16 may store two or more prototype anti-aliasing filters in which each of the prototype filters has different bandwidth with different corresponding factors.

Frequency determination module 40 within frequency selector 22 determines a set of intermediate sampling frequencies based on the desired output sampling frequency of the digital signal and the factors associated with the prototype anti-aliasing filter (74). The set of intermediate sampling frequencies are integer multiples of the desired output sampling frequency, $f_o$, where the integers are the factors associated with the prototype filter. For example, if the prototype anti-aliasing filter has bandwidth $\pi/12$, the corresponding factors are 2, 3, 4, 6 and 12. Frequency determination module 40 determines the set of intermediate sampling frequencies to be $2f_o$, $3f_o$, $4f_o$, $6f_o$, and $12f_o$.

Comparison module 44 within frequency selector 22 then compares the input sampling frequency of the digital signal with the set of intermediate sampling frequencies (76). Based on the comparison, comparison module 44 determines the lowest one of the set of intermediate sampling frequencies that is greater than or equal to the input sampling frequency (78). Frequency selector 22 then selects the one of the set of intermediate sampling frequencies as the intermediate sampling frequency of the digital signal (80). For example, if the input sampling frequency is between $2f_o$ and $3f_o$, frequency selector 22 selects $3_{fo}$ to be the intermediate sampling frequency of the digital signal.

Figure 6:
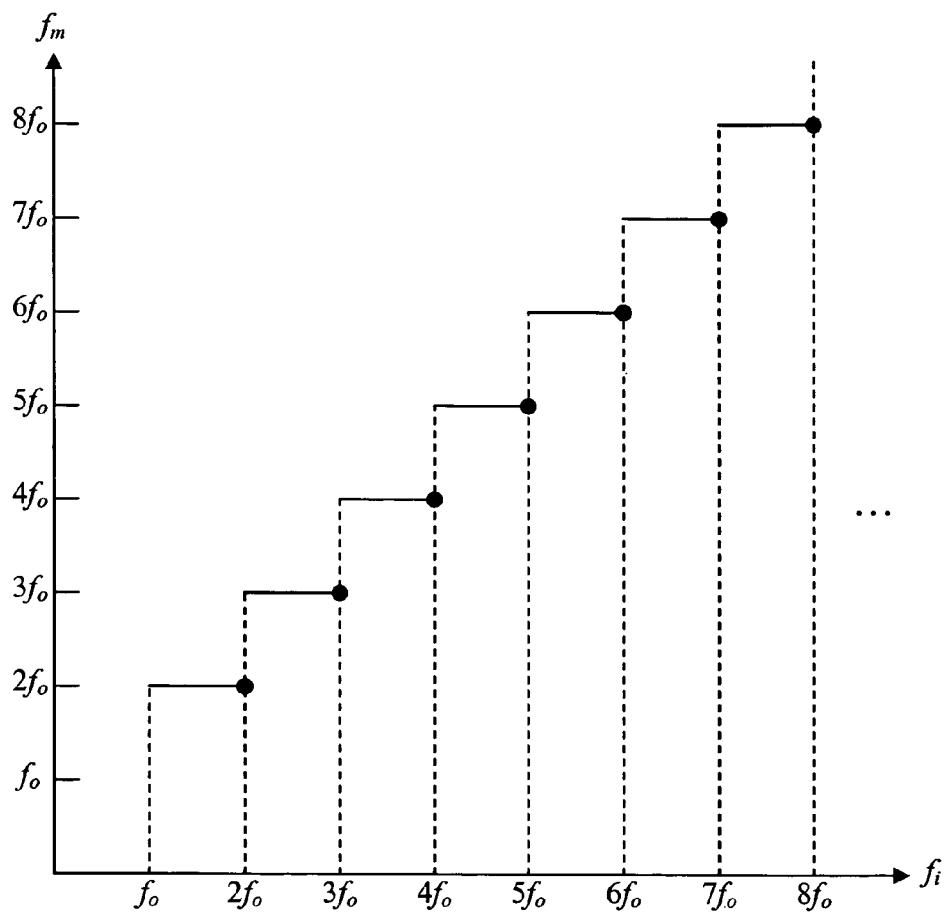
FIG. 6 is a plot illustrating a set of intermediate sampling frequencies that are consecutive integer multiples of a desired output sampling frequency.

FIG. 6 is a plot illustrating a set of intermediate sampling frequencies 84 that are consecutive integer multiples of a desired output sampling frequency, $f_o$. The horizontal axis in FIG. 6 represents input sampling frequencies of the digital signal. The vertical axis in FIG. 6 represents the set of intermediate sampling frequencies 84 of the digital signal. In the example of FIG. 6, the set of intermediate sampling frequencies 84 includes $2f_o$, $3f_o$, $4f_o$, $5f_o$, $6f_o$, $7f_o$ and $8f_o$. Therefore, in accordance with the disclosure, the associated prototype anti-aliasing filter must have a bandwidth with corresponding factors of 2, 3, 4, 5, 6, 7 and 8.

As shown in the plot, an intermediate sampling frequency, $f_m$, of a digital signal is selected from the set of intermediate sampling frequencies 84 equal to the lowest integer multiple of the desired output sampling frequency that is greater than or equal to an input sampling frequency, $f_i$, of the digital signal. In other words, if the input sampling frequency of the digital signal is between any of the consecutive integer multiples of the desired output sampling frequency, the intermediate sampling frequency of the digital signal is selected to be the integer multiple that is greater than or equal to the input sampling frequency. For example, if $(n-1)f_o < f_i \leq nf_o$, then $f_m = nf_o$. The filled dots shown in FIG. 6 indicate that the intermediate sampling frequency $f_m$ is selected to be $nf_o$ when the input frequency $f_i$ is equal to $nf_o$. In this case, no up-sampling is necessary.

For the illustrated set of intermediate sampling frequencies 84, the prototype anti-aliasing filter stored in memory would need to have a narrow bandwidth in order to produce the consecutive integer multiples $2f_o$, $3f_o$, $4f_o$, $5f_o$, $6f_o$, $7f_o$ and $8f_o$. Therefore, the prototype filter may be relatively long and consume a large amount of storage space in the memory. However, storing the single prototype anti-aliasing filter requires significantly less space in memory than storing individual anti-aliasing filters for each of the factors associated with the prototype filter.

Figure 7:
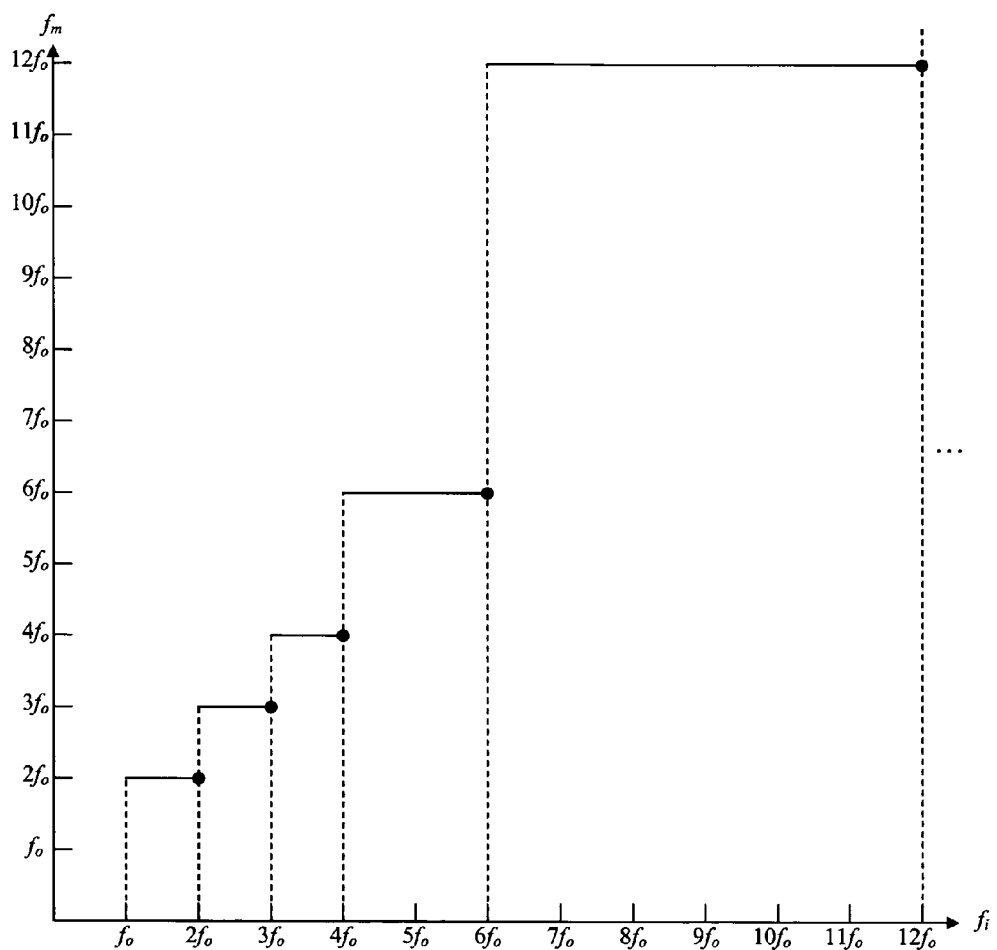
FIG. 7 is a plot illustrating another set of intermediate sampling frequencies that are nonconsecutive integer multiples of a desired output sampling frequency.

FIG. 7 is a plot illustrating another set of intermediate sampling frequencies 86 that are nonconsecutive integer multiples of a desired output sampling frequency, $f_o$. The horizontal axis in FIG. 7 represents input sampling frequencies of the digital signal. The vertical axis in FIG. 7 represents the set of intermediate sampling frequencies 86 of the digital signal. In the example of FIG. 7, the set of intermediate sampling frequencies 86 includes $2f_o$, $3f_o$, $4f_o$, $6f_o$ and $12f_o$. Therefore, in accordance with the disclosure, the associated prototype anti-aliasing filter must have a bandwidth with corresponding factors of 2, 3, 4, 6 and 12. In this case, the prototype filter may have bandwidth $\pi/12$.

As shown in the plot, an intermediate sampling frequency, $f_m$, of a digital signal is selected from the set of intermediate sampling frequencies 86 equal to the lowest integer multiple of the desired output sampling frequency that is greater than or equal to an input sampling frequency, $f_i$, of the digital signal. In other words, if the input sampling frequency of the digital signal is between any of the nonconsecutive integer multiples of the desired output sampling frequency, the intermediate sampling frequency of the digital signal is selected to be the integer multiple that is greater than or equal to the input sampling frequency. For example, if $4f_o < f_i \leq 6f_o$, then $f_m = 6f_o$. In addition, if $6f_o < f_i \leq 12f_o$, then $f_m = 12f_o$. The filled dots shown in FIG. 7 indicate that the intermediate sampling frequency $f_m$ is selected to be one of the integer multiples when the input frequency $f_i$ is equal to the same one of the integer multiples. For example, $f_m = 6f_o$ when $f_i = 6f_o$. In this case, no up-sampling is necessary.

For the illustrated set of intermediate sampling frequencies 86, the prototype anti-aliasing filter stored in memory may have bandwidth π/12, which is a relatively wide bandwidth, in order to produce the nonconsecutive integer multiples $2f_o$, $3f_o$, $4f_o$, $6f_o$ and $12f_o$. Therefore, the prototype filter may be relatively short and consume a small amount of storage space in the memory compared to the example shown in FIG. 6.

A number of embodiments have been described. However, various modifications to these embodiments are possible, and the principles presented herein may be applied to other embodiments as well. Methods as described herein may be implemented in hardware, software, and/or firmware. The various tasks of such methods may be implemented as sets of instructions executable by one or more arrays of logic elements, such as microprocessors, embedded controllers, or IP cores. In one example, one or more such tasks are arranged for execution within a mobile station modem chip or chipset that is configured to control operations of various devices of a personal communications device such as a cellular telephone.

The techniques described in this disclosure may be implemented within a general purpose microprocessor, digital signal processor (DSP), application specific integrated circuit (ASIC), field programmable gate array (FPGA), complex programmable logic device (CPLD) or other equivalent logic devices. If implemented in software, the techniques may be embodied as instructions on a computer-readable medium such as random access memory (RAM), read-only memory (ROM), non-volatile random access memory (NVRAM), electrically erasable programmable read-only memory (EEPROM), FLASH memory, or the like. The instructions cause one or more processors to perform certain aspects of the functionality described in this disclosure.

As further examples, an embodiment may be implemented in part or in whole as a hard-wired circuit, as a circuit configuration fabricated into an application-specific integrated circuit, or as a firmware program loaded into non-volatile storage or a software program loaded from or into a data storage medium as machine-readable code, such code being instructions executable by an array of logic elements such as a microprocessor or other digital signal processing unit. The data storage medium may be an array of storage elements such as semiconductor memory (which may include without limitation dynamic or static RAM, ROM, and/or flash RAM) or ferroelectric, ovonic, polymeric, or phase-change memory; or a disk medium such as a magnetic or optical disk.

In this disclosure, various techniques have been described for performing sampling rate conversion in the digital domain. The techniques include storing a prototype anti-aliasing filter that has a bandwidth with multiple factors in memory. The techniques further include selecting an intermediate sampling frequency to be an integer multiple of a desired output sampling frequency of a digital signal based on the factors of the prototype filter stored in memory, and selecting a down-sampling factor to be the same integer associated with the selected intermediate sampling frequency.

A filter generator then generates an anti-aliasing filter for the selected down-sampling factor based on the prototype filter using decimation. A sampling rate converter that includes both an up-sampler and a down-sampler up-samples the digital signal at an inpout sampling frequency to the selected intermediate sampling frequency, filters the digital signal with the derived anti-aliasing filter, and then down-samples the digital signal by the selected down-sampling factor to the desired output sampling frequency. In this way, only one prototype filter may need to be stored in memory.

Furthermore, the stored prototype anti-aliasing filter may be a relatively short prototype filter with a reduced number of factors.

Although described primarily in reference to converting sampling rates of digital signals in wireless communication devices, the sampling rate conversion techniques may be implemented in wired communication devices, packet based communication devices or other devices such as audio playback devices, recording devices, and display devices, which may or may not support communication. These and other embodiments are within the scope of the following claims.

The invention claimed is:

1. A method comprising:
providing a prototype anti-aliasing filter having a bandwidth with multiple factors;
selecting an intermediate sampling frequency of a digital signal to be an integer multiple of a desired output sampling frequency of the digital signal, wherein said integer multiple comprises the multiple factors associated with the prototype anti-aliasing filter;
up-sampling the digital signal at an input sampling frequency to the selected intermediate sampling frequency; and
down-sampling the digital signal at the selected intermediate sampling frequency to the desired output sampling frequency.

2. The method of claim 1, further comprising determining the desired output sampling frequency of the digital signal based on an application of the digital signal.

3. The method of claim 1, further comprising selecting a down-sampling factor of the digital signal to be an integer associated with the selected intermediate sampling frequency, wherein down-sampling the digital signal comprises decimating the digital signal by the selected down-sampling factor.

4. The method of claim 3, further comprising:
generating an anti-aliasing filter for the selected down-sampling factor of the digital signal based on the prototype anti-aliasing filter; and
filtering the digital signal at the intermediate sampling frequency with the anti-aliasing filter generated for the selected down-sampling factor of the digital signal.

5. The method of claim 1, wherein selecting the intermediate sampling frequency comprises selecting a lowest integer multiple of the desired output sampling frequency that is greater than or equal to the input sampling frequency.

6. The method of claim 1, further comprising:
selecting a down-sampling factor of the digital signal to be the one of the multiple factors associated with the intermediate sampling frequency;
generating an anti-aliasing filter for the selected down-sampling factor of the digital signal by decimating the prototype anti-aliasing filter; and
filtering the digital signal at the selected intermediate sampling frequency with the anti-aliasing filter generated for the selected down-sampling factor of the digital signal.

7. The method of claim 1, wherein selecting the intermediate sampling frequency comprises:
retrieving factors associated with the prototype anti-aliasing filter;
determining a set of intermediate sampling frequencies based on the desired output sampling frequency and the factors associated with the prototype anti-aliasing filter; and
selecting one of the set of intermediate sampling frequencies as the intermediate sampling frequency of the digital signal.

8. The method of claim 7, wherein selecting one of the set of intermediate sampling frequencies comprises:
   comparing the input sampling frequency with the set of intermediate sampling frequencies;
   determining a lowest one of the set of intermediate sampling frequencies that is greater than or equal to the input sampling frequency; and
   selecting the one of the set of intermediate sampling frequencies as the intermediate sampling frequency of the digital signal.

9. The method of claim 7, wherein determining a set of intermediate sampling frequencies comprises determining a set of multiples of the desired output frequency and the factors associated with the prototype anti-aliasing filter.

10. The method of claim 7, wherein the factors associated with the prototype anti-aliasing filter are one of consecutive or nonconsecutive.

11. The method of claim 1, further comprising sampling an analog signal at the input sampling frequency to create the digital signal.

12. A computer-readable medium having a computer program embodied therein, the computer-readable medium comprising instructions that perform the acts of:
   providing a prototype anti-aliasing filter having a bandwidth with multiple factors;
   selecting an intermediate sampling frequency of the digital signal to be an integer multiple of a desired output sampling frequency of the digital signal, wherein said integer multiple comprises the multiple factors associated with the prototype anti-aliasing filter;
   up-sampling the digital signal at an input sampling frequency to the selected intermediate sampling frequency; and
   down-sampling the digital signal at the selected intermediate sampling frequency to the desired output sampling frequency.

13. The computer-readable medium of claim 12, further comprising instructions that perform the acts of determining a down-sampling factor of the digital signal to be an integer associated with the selected intermediate sampling frequency, and decimating the digital signal by the selected down-sampling factor.

14. The computer-readable medium of claim 13, further comprising instructions that perform the acts of:
   generating an anti-aliasing filter for the selected down-sampling factor of the digital signal based on the prototype anti-aliasing filter; and
   filtering the digital signal at the intermediate sampling frequency with the anti-aliasing filter generated for the selected down-sampling factor of the digital signal.

15. The computer-readable medium of claim 12, wherein the instructions perform the act of selecting the lowest integer multiple of the desired output sampling frequency that is greater than or equal to the input sampling frequency.

16. The computer-readable medium of claim 12, further comprising instructions that perform the acts of:
   selecting a down-sampling factor of the digital signal to be the one of the multiple factors associated with the intermediate sampling frequency;
   generating an anti-aliasing filter for the selected down-sampling factor of the digital signal by decimating the prototype anti-aliasing filter; and
   filtering the digital signal at the selected intermediate sampling frequency with the anti-aliasing filter generated for the selected down-sampling factor of the digital signal.

17. The computer-readable medium of claim 12, wherein the instructions perform the acts of:
   retrieving factors associated with the prototype anti-aliasing filter;
   determining a set of intermediate sampling frequencies based on the desired output sampling frequency and the factors associated with the prototype anti-aliasing filter; and
   selecting one of the set of intermediate sampling frequencies as the intermediate sampling frequency of the digital signal.

18. The computer-readable medium of claim 17, wherein the instructions perform the acts of:
   comparing the input sampling frequency with the set of intermediate sampling frequencies;
   determining a lowest one of the set of intermediate sampling frequencies that is greater than or equal to the input sampling frequency; and
   selecting the one of the set of intermediate sampling frequencies as the intermediate sampling frequency of the digital signal.

19. The computer-readable medium of claim 17, wherein the instructions perform the act of determining a set of multiples of the desired output frequency and the factors associated with the prototype anti-aliasing filter.

20. A device comprising:
   a prototype anti-aliasing filter having a bandwidth with multiple factors;
   a controller configured to select an intermediate sampling frequency of a digital signal to be an integer multiple of a desired output sampling frequency of the digital signal, wherein said integer multiple comprises the multiple factors associated with the prototype anti-aliasing filter; and
   a sample rate converter configured to convert a sampling rate of a digital signal in the digital domain, wherein the sample rate converter up-samples the digital signal at an input sampling frequency to the selected intermediate sampling frequency, and down-samples the digital signal at the selected intermediate sampling frequency to the desired output sampling frequency.

21. The device of claim 20, wherein the controller determines the desired output sampling frequency of the digital signal based on an application of the digital signal.

22. The device of claim 20,
   wherein the controller selects a down-sampling factor of the digital signal to be an integer associated with the selected intermediate sampling frequency; and
   the sampling rate converter decimates the digital signal by the down-sampling factor to down-sample the digital signal at the selected intermediate sampling frequency to the desired output sampling frequency.

23. The device of claim 22, further comprising a filter generator that generates an anti-aliasing filter within the down-sampler for the selected down-sampling factor of the digital signal based on the prototype anti-aliasing filter stored in a memory within the device, wherein the down-sampler filters the digital signal at the intermediate sampling frequency with the anti-aliasing filter generated for the selected down-sampling factor of the digital signal.

24. The device of claim 20, further comprising a frequency selector that selects the lowest integer multiple of the desired output sampling frequency that is greater than or equal to the input sampling frequency as the intermediate sampling frequency of the digital signal.

25. The device of claim 20, further comprising a memory that stores the prototype anti-aliasing filter that has the bandwidth with multiple factors.

26. The device of claim 20, wherein the controller is a processor.

27. The device of claim 20, further comprising:
a frequency selector that retrieves factors associated with the prototype anti-aliasing filter stored in a memory within the device; and
a frequency determination module within the frequency selector that determines a set of intermediate sampling frequencies based on the desired output sampling frequency and the factors associated with the prototype anti-aliasing filter, wherein the frequency selector selects one of the set of intermediate sampling frequencies as the intermediate sampling frequency of the digital signal.

28. The device of claim 27, further comprising a comparison module within the frequency selector that compares the input sampling frequency with the set of intermediate sampling frequencies, and determines a lowest one of the set of intermediate sampling frequencies that is greater than or equal to the input sampling frequency, wherein the frequency selector selects the one of the set of intermediate sampling frequencies as the intermediate sampling frequency of the digital signal.

29. The device of claim 27, wherein the frequency determination module determines a set of multiples of the desired output frequency and the factors associated with the prototype anti-aliasing filter.

30. The device of claim 27, wherein the factors associated with the prototype anti-aliasing filter are one of consecutive or nonconsecutive.

31. The device of claim 20, further comprising a sampler that samples an analog signal at the input sampling frequency to create the digital signal.

32. The device of claim 20, wherein the device is one of a wireless communication device, a wired communication device, a packet based communication device, an audio playback device, a recording device, and a display device.

33. A device comprising:
means for providing a prototype anti-aliasing filter having a bandwidth with multiple factors;
means for selecting an intermediate sampling frequency of a digital signal to be an integer multiple of a desired output sampling frequency of the digital signal, wherein said integer multiple comprises the multiple factors associated with the prototype anti-aliasing filter;
means for up-sampling the digital signal at an input sampling frequency to the selected intermediate sampling frequency; and
means for down-sampling the digital signal at the selected intermediate sampling frequency to the desired output sampling frequency.

34. The device of claim 33, further comprising means for selecting a down-sampling factor of the digital signal to be an integer associated with the selected intermediate sampling frequency, wherein down-sampling the digital signal comprises means for decimating the digital signal by the selected down-sampling factor.

35. The device of claim 33, wherein means for selecting the intermediate sampling frequency comprises means for selecting a lowest integer multiple of the desired output sampling frequency that is greater than or equal to the input sampling frequency.

36. The device of claim 33, further comprising:
means for selecting a down-sampling factor of the digital signal to be the one of the multiple factors associated with the intermediate sampling frequency;
means for generating an anti-aliasing filter for the selected down-sampling factor of the digital signal by decimating the prototype anti-aliasing filter; and
means for filtering the digital signal at the selected intermediate sampling frequency with the anti-aliasing filter generated for the selected down-sampling factor of the digital signal.

37. The device of claim 33, wherein selecting the intermediate sampling frequency comprises:
means for retrieving factors associated with the prototype anti-aliasing filter;
means for determining a set of intermediate sampling frequencies based on the desired output sampling frequency and the factors associated with the prototype anti-aliasing filter; and
means for selecting one of the set of intermediate sampling frequencies as the intermediate sampling frequency of the digital signal.

38. The device of claim 37, wherein means for selecting one of the set of intermediate sampling frequencies comprises:
means for comparing the input sampling frequency with the set of intermediate sampling frequencies;
means for determining a lowest one of the set of intermediate sampling frequencies that is greater than or equal to the input sampling frequency; and
means for selecting the one of the set of intermediate sampling frequencies as the intermediate sampling frequency of the digital signal.

39. The device of claim 37 wherein means for determining a set of intermediate sampling frequencies comprises means for determining a set of multiples of the desired output frequency and the factors associated with the prototype anti-aliasing filter.

* * * * *